United States Patent
Takagi et al.

(10) Patent No.: US 8,123,875 B2
(45) Date of Patent: *Feb. 28, 2012

(54) AG BASE SPUTTERING TARGET AND PROCESS FOR PRODUCING THE SAME

(75) Inventors: Katsutoshi Takagi, Kobe (JP); Junichi Nakai, Kobe (JP); Yuuki Tauchi, Kobe (JP); Hitoshi Matsuzaki, Takasago (JP); Hideo Fujii, Takasago (JP)

(73) Assignees: Kabushiki Kaisha Kobe Seiko Sho, Kobe-shi (JP); Kobelco Research Institute, Inc., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/793,257

(22) Filed: Jun. 3, 2010

(65) Prior Publication Data

US 2010/0264018 A1    Oct. 21, 2010

Related U.S. Application Data

(63) Continuation of application No. 10/564,502, filed as application No. PCT/JP2004/010380 on Jul. 14, 2004, now Pat. No. 7,763,126.

(30) Foreign Application Priority Data

Jul. 16, 2003    (JP) ................. 2003-275621

(51) Int. Cl.
    *C23C 14/34*    (2006.01)

(52) U.S. Cl. ...................... 148/421; 148/400

(58) Field of Classification Search .......... 148/421, 148/400
    See application file for complete search history.

(56) References Cited

U.S. PATENT DOCUMENTS

| 6,238,494 | B1 | 5/2001 | Segal |
| 7,763,126 | B2 * | 7/2010 | Takagi et al. ............... 148/421 |
| 2004/0226818 | A1 | 11/2004 | Takagi et al. |
| 2004/0238356 | A1 | 12/2004 | Matsuzaki et al. |
| 2010/0065425 | A1 | 3/2010 | Matsuzaki et al. |

FOREIGN PATENT DOCUMENTS

| JP | 6-264232 | 9/1994 |
| JP | 6-299342 | 10/1994 |
| JP | 9-324264 | 12/1997 |
| JP | 10-330923 | 12/1998 |
| JP | 2000-239835 | 9/2000 |
| JP | 2000-345327 | 12/2000 |
| JP | 2001-76955 | 3/2001 |
| JP | 2002-183462 | 6/2002 |
| JP | 2002-183463 | 6/2002 |
| JP | 2003-34828 | 2/2003 |

(Continued)

*Primary Examiner* — Jie Yang

(74) *Attorney, Agent, or Firm* — Oblon, Spivak, McClelland, Maier & Neustadt, L.L.P.

(57) ABSTRACT

An Ag sputtering target 6 has three-dimensional fluctuation of grain sizes of not more than 18%. The fluctuation is determined by exposing plural sputtering surfaces by slicing the sputtering target 6 in planes to initial sputtering surface, selecting plural locations on each of the exposed sputtering surfaces, calculating values A1 and B1 using the formula below, and selecting larger one of the values A1 and B1 as the three-dimensional fluctuation of the grain sizes.

$A1=(D_{max}-D_{ave})/D_{ave}\times100(\%)$ $B1=(D_{ave}<D_{min})/D_{ave}\times100(\%)$ $D_{max}$: maximum value among the grain sizes D at all the selected locations $D_{min}$: minimum value among the grain sizes D at all the selected locations $D_{ave}$: average value of the grain sizes D at all the selected locations.

9 Claims, 5 Drawing Sheets

FOREIGN PATENT DOCUMENTS

| | | |
|---|---|---|
| JP | 2003-89830 | 3/2003 |
| JP | 2003-113433 | 4/2003 |
| JP | 2004-43868 | 2/2004 |
| JP | 2004-84065 | 3/2004 |
| WO | 01/12358 | 2/2001 |
| WO | WO 03/046250 A1 | 6/2003 |

* cited by examiner

AG BASE SPUTTERING TARGET AND PROCESS FOR PRODUCING THE SAME

CROSS-REFERENCE TO RELATED APPLICATIONS

This application is a continuation of and claims the benefit of priority under 35 U.S.C. §120 from U.S. Ser. No. 10/564,502, filed Jan. 13, 2006, the entire content of which is incorporated herein by reference. The U.S. Ser. No. 10/564,502 is a national stage of PCT/JP04/10380, filed Jul. 14, 2004, and claims the benefit of priority under 35 U.S.C. §119 of Japanese Application No. 2003-275621, filed Jul. 16, 2003.

TECHNICAL FIELD

The present invention relates to an Ag sputtering target and associated techniques useful for forming Ag thin films by sputtering.

BACKGROUND ART

Ag thin films of pure Ag or Ag alloy and like have superior optical characteristics such as high reflectivity and transmissivity and a low extinction coefficient, superior thermal characteristics with high thermal conductivity, and superior electrical characteristics with low electrical resistance, as well as superior surface smoothness. Therefore, the Ag thin films have been broadly applied to many applications including: reflective films, semi-transparent reflective films, and thermal diffusion films for information recording media; low-E films for heat ray reflective/shield films; and shield films for electromagnetic wave shield films.

Such kinds of Ag thin films are produced, for example, by sputtering using an Ag sputtering target. Many attempt for improving the Ag sputtering target has been conducted (for example, Japanese Patent Application Laid-open Publication No. 9-324264 and Japanese Patent Application Laid-open Publication No. 2000-239835). Specifically, Japanese Patent Application Laid-open Publication No. 9-324264 reports that the sputtering target formed by a silver alloy (or silver based composite metal) comprising 0.1 to 2.5 at % gold and 0.3 to 3 at % copper can prevent adverse effects caused by ambient gas during sputtering such as oxygen (reduction of optical transmissivity and optical reflectivity on the short wavelength side of the visible region). Further, Japanese Patent Application Laid-Open Publication No. 2000-239835 discloses that setting the ((111)+(200))/(220) plane orientation ratio of the Ag sputtering target equal to or more than 2.20 can raise sputtering rates, resulting in improved thin film production efficiency.

DISCLOSURE OF INVENTION

Technical Problems to be Solved by the Invention

In addition to surface smoothness and superior optical, thermal, and electrical characteristics, superior uniformity in component composition and in film thickness across the film surface are also required in Ag thin film. For example, when using Ag thin film as a semi-transparent reflective film in read-only DVDs (digital versatile discs) with a double layer structure on one side, since film thickness is extremely thin at approximately 10 to 20 nm, the uniformity of film thickness and component composition in the film surface has a great effect on optical characteristics such as the reflectivity and transmissivity, greatly affecting the signal reproduction performance of the read-only DVD. In addition, heat is generated in recordable and rewritable DVDs when irradiating a recording film with laser light in order to record signals. Because having a great influence on the signal recording performance of the recordable and rewritable DVDs, this heat need to be rapidly radiated. Therefore, when using Ag thin films as the reflective film of these recordable and rewritable DVDs, high reflectivity and thermal conductivity as well as uniformity across the film surface are required. It may be anticipated that the same characteristics will be for next generation optical information recording media as well as DVDs.

Thus, the present inventors conducted numerous studies in order to form thin films with uniform film thickness and component composition across the film surface, and filed patent application regarding sputtering targets useful in order to form thin films having these kinds of characteristics (Japanese Patent Application Nos. 2002-183462 and 2002-183463). In the invention related to Japanese Patent Application No. 2002-183462, metallic microstructure of an Ag alloy sputtering target is controlled by controlling the production process of the Ag alloy sputtering target (cooling rate when forging, working rate during hot work, working rate during cold work, processing temperature during heat treatment after cold work and like). For example, the average grain size is controlled to 100 μm or less, and the maximum grain size is controlled to 200 μm or less. Then, it was confirmed that a thin film with uniform film thickness and component composition could be made if a very fine grain size is set for the Ag alloy sputtering target. Further, in the invention related to Japanese Patent Application No. 2002-183463, the crystal orientation of the Ag alloy sputtering target is controlled by controlling the production process of the Ag alloy sputtering target (working rate during cold work, thermal processing temperature after cold work and like), and by using recrystallization in the heat treatment to make the crystal orientation uniform. Specifically, fluctuation of the X-ray diffraction peak intensity ratios is controlled to 20% or less. It is confirmed that thin film with a uniform film thickness can be made by suppressing the fluctuation of the X-ray diffraction peak intensity ratios across the sputtering surface.

In the inventions of the Japanese Patent Application Nos. 2002-183462 and 2002-183463, the Ag alloy sputtering targets are produced by rolling Ag alloy ingot, and then punching out disks from the rolled plate.

Meanwhile, it is preferable to be able to form thin films with high quality from beginning to end of usage of the sputtering target. Specifically, even if a sputtering target is obtained that can form thin films with uniform thickness and component composition across the film surface as described above, it is preferable that these kinds of superior thin film characteristics always be maintained from beginning to end of usage of the sputtering target. Further, it is preferable to obtain thin film with even superior uniformity of thickness and component composition.

Considering these issues, an object of the present invention is to provide technologies related to Ag sputtering targets that can stably form thin films with superior uniformity of thickness across the film surface continuously from beginning to end of the usage of the sputtering target.

Other object of the present invention is to provide technologies related to Ag sputtering targets that, continuously from the first to last sputtering target that can stably form thin films with superior uniformity of component composition across the film surface continuously from beginning to end of the usage even when forming Ag alloy thin film.

Yet other object of the present invention is to offer technologies related to Ag sputtering targets that can stably form thin films with even more improved uniformity of thickness and component composition across the film surface.

Method for Solving the Problems

As a result of repeated intense studies to resolve the aforementioned problems, the present inventors discovered that, when producing the Ag sputtering target by solid forging an Ag columnar mass (ingot, hot process body and like) in an axial direction thereof while maintaining the columnar form, cold upsetting the obtained solid forged columnar mass in the axial direction while maintaining the columnar shape, and then slicing the obtained cold upset columnar mass into rounds, followings are achieved. The grain size and crystal orientation (X-ray diffraction peak intensity ratio) and like have uniformity even in both directions of across the sputtering surface and throughout the thickness of the sputtering target (in other words, three-dimensional fluctuation of grain sizes and three-dimensional fluctuation of X-ray diffraction peak intensity ratios can be suppressed). Then, when forming thin films using this kind of Ag sputtering target, the thickness of the thin film is uniform across the film surface and the component composition is also uniform across the film surface from beginning to end of the usage of the sputtering target. Further, the uniformity of the thickness and of the component composition of the film surface is remarkably improved. The present inventors achieved the present invention on the basis of these discoveries.

Specifically, a first aspect of the present invention provides an Ag sputtering target, wherein the Ag sputtering target has three-dimensional fluctuation of grain sizes not more than 18%; and wherein the three-dimensional fluctuation of the grain sizes measured by:

exposing a plurality of sputtering surfaces by slicing the Ag sputtering target in planes parallel to a sputtering starting surface, selecting a plurality of locations on each of the exposed sputtering surfaces, and measuring grain sizes D at all the selected locations of all the exposed sputtering surfaces by executing i) to iv) below, i) taking an optical micrograph of the selected location, ii) drawing a plurality of straight lines equal to or more than four in a grid pattern on the obtained micrograph, iii) investigating a number n of grain boundaries on each of the straight lines, and calculating a grain size d (unit: μm) for each of the straight lines on the basis of the following formula:

$d=L/(n \cdot m)$ wherein

L: length of the straight line, n: number of the grain boundaries on the straight line, m: magnification of the optical micrograph, and iv) calculating the grain size D at the selected location as an average value of the grain sizes d for the plurality of straight lines;

calculating values A1 and B1 using the formula below and based on the results of measurement of the grain sizes D at all the selected locations of all the exposed sputtering surfaces:

$A1=(D_{max}-D_{ave})/D_{ave} \times 100(\%)$ $B1=(D_{ave}-D_{min})/D_{ave} \times 100(\%)$ wherein $D_{max}$: maximum value among the grain sizes D at all the selected locations $D_{min}$: minimum value among the grain sizes D at all the selected locations $D_{ave}$: average value of the grain sizes D at all the selected locations; and selecting larger one of the values A1 and B1 as the three-dimensional fluctuation of the grain sizes.

The average grain size $D_{ave}$ is not more than 100 μm, and the maximum grain size $D_{max}$ is normally not more than 120 μm.

Further, a second aspect of the present invention provides An Ag sputtering target, wherein the Ag sputtering target has three-dimensional fluctuation of X-ray diffraction peak intensity ratios ($X_2/X_1$) not more than 35%; and wherein the three-dimensional fluctuation of the X-ray diffraction peak intensity ratios ($X_2/X_1$) is measured by:

exposing a plurality of sputtering surfaces by slicing the Ag sputtering target in planes parallel to a sputtering starting surface;

selecting a plurality of locations on each of the exposed sputtering surfaces;

measuring the X-ray diffraction peak intensities of the Ag at all the selected locations of all the exposed sputtering surfaces;

calculating the X-ray diffraction peak intensity ratio ($X_2/X_2$) for each of the selected locations, the X-ray diffraction peak intensity ratio ($X_2/X_2$) being defined as the ratio of the largest Ag X-ray diffraction peak intensity $X_1$ in relation to the second largest Ag X-ray diffraction peak intensity $X_2$;

calculating values A2 and B2 using the formula below and based on the X-ray diffraction peak intensity ratios ($X_2/X_1$) at all the selected locations of all the exposed sputtering surfaces, $A2=(R_{max}-R_{ave})/R_{ave} \times 100(\%)$ $B2=(R_{ave}-R_{min})/R_{ave} \times 100(\%)$ wherein $R_{max}$: maximum value among the X-ray diffraction peak intensity ratios ($X_2/X_1$) at all selected locations $R_{min}$: minimum value among the X-ray diffraction peak intensity ratios ($X_2/X_1$) at all selected locations $R_{ave}$: average value of the X-ray diffraction peak intensity ratios ($X_2/X_1$) at all selected locations; and selecting the larger one of the values A2 and B2 as the three-dimensional fluctuation of the X-ray diffraction peak intensity ratio ($X_2/X_1$).

The Ag sputtering target of the present invention preferably has a disk-like shape, and may be formed by Ag alloy containing rare-earth metal. A content of the rare-earth metal content is, for example, not more than 5 atomic percent (not including 0 atomic percent).

The Ag sputtering target of the present invention can be produced by conducting a cold forging operation one or more times, the cold forging operation comprising, solid forging an Ag columnar mass (such as ingot or hot process mass, including a cold process mass if conducting the cold forging process multiple times) so as to be extended in a axial direction thereof, and cold upsetting the solid forged Ag columnar mass in the axial direction while maintaining a columnar shape of the solid forged Ag columnar mass; and slicing a cold-worked columnar mass obtained by the cold forging operation in rounds after being heat treatment.

The method for producing Ag thin film that is sputtered with the Ag sputtering target is also included in the present invention.

Advantageous Effects Compared to Prior Arts

According to the Ag sputtering target of the present invention, thin films with superior uniformity of thickness across the film surface can be stably formed continuously from beginning to end of usage of the sputtering target, because the grain size and crystal orientation (X-ray diffraction peak intensity ratio) is three-dimensionally uniformed. Further, enhanced uniformity of the component composition across the film surface can be obtained from beginning to end of usage of the sputtering continuously.

BRIEF DESCRIPTION OF DRAWINGS

Other objects and characteristics of the present invention will become more apparent by following description with reference to attached drawings wherein.

BEST MODE FOR CARRYING OUT THE INVENTION

An Ag sputtering target of the present invention is characterized in that at least one of grain size and crystal orientation has uniformity not only across a plate surface (sputtering surface) but also through the plate thickness, i.e. uniformity in three-dimensions. This kind of sputtering target can form an Ag thin film with uniform thickness (and also component composition, if using an Ag alloy) across the film surface, and also can also continuously and stably form the Ag thin film with uniform thickness (and component composition) across the film surface from beginning to end of the usage of the sputtering target. Further, the uniformity of the film thickness and component composition can be remarkably improved.

Figure 1:
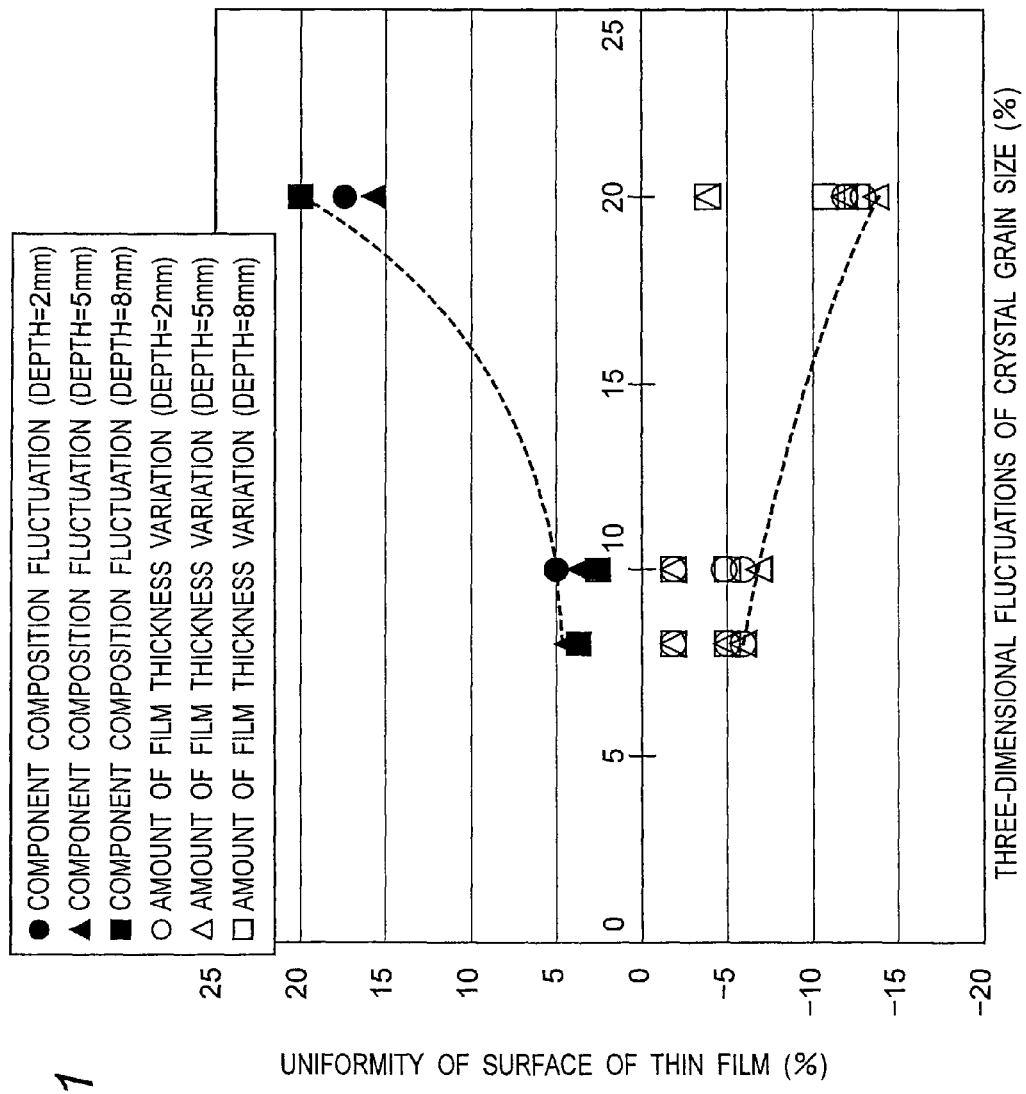
FIG. 1 is a graph showing relationships of three-dimensional fluctuations of grain sizes to component composition fluctuations and amount of film thickness variations.

These characteristics of the present invention will be explained more quantitatively based on the following. Specifically, in the Ag sputtering target of the present invention, at least one of "three-dimensional fluctuation of grain sizes" and "three-dimensional fluctuation of X-ray diffraction peak intensity ratios (equivalent to three-dimensional fluctuation of crystal orientations)" is suppressed by methods described later. FIG. 1 indicates the relationship of the three-dimensional fluctuation of grain sizes of the sputtering target with the uniformity of the surface of the thin film obtained (amount of variations of thickness across the film surface, fluctuation of component composition across the film surface), and FIG. 2 indicates the relationship of the three-dimensional fluctuation of X-ray diffraction peak intensity ratios of the sputtering target with the uniformity of the surface of the thin film obtained (amount of variations of thickness across the film surface, fluctuation of component composition across the film surface). Further, in FIGS. 1 and 2 also indicates how the uniformity across the surface of the thin film varies when continuously using the sputtering target. The uniformity across the surface of thin film obtained from a sputtering surface at the depth of 2 mm is indicated by black circles and white circles. The uniformity across the surface of thin film obtained from a sputtering surface at the depth of 5 mm is indicated by black triangles and white triangles. The uniformity across the surface of thin film obtained from a sputtering surface at the depth of 8 mm is indicated by black squares and white squares (the black indicates component composition fluctuation, and the white indicates the amount of film thickness variation).

Figure 2:
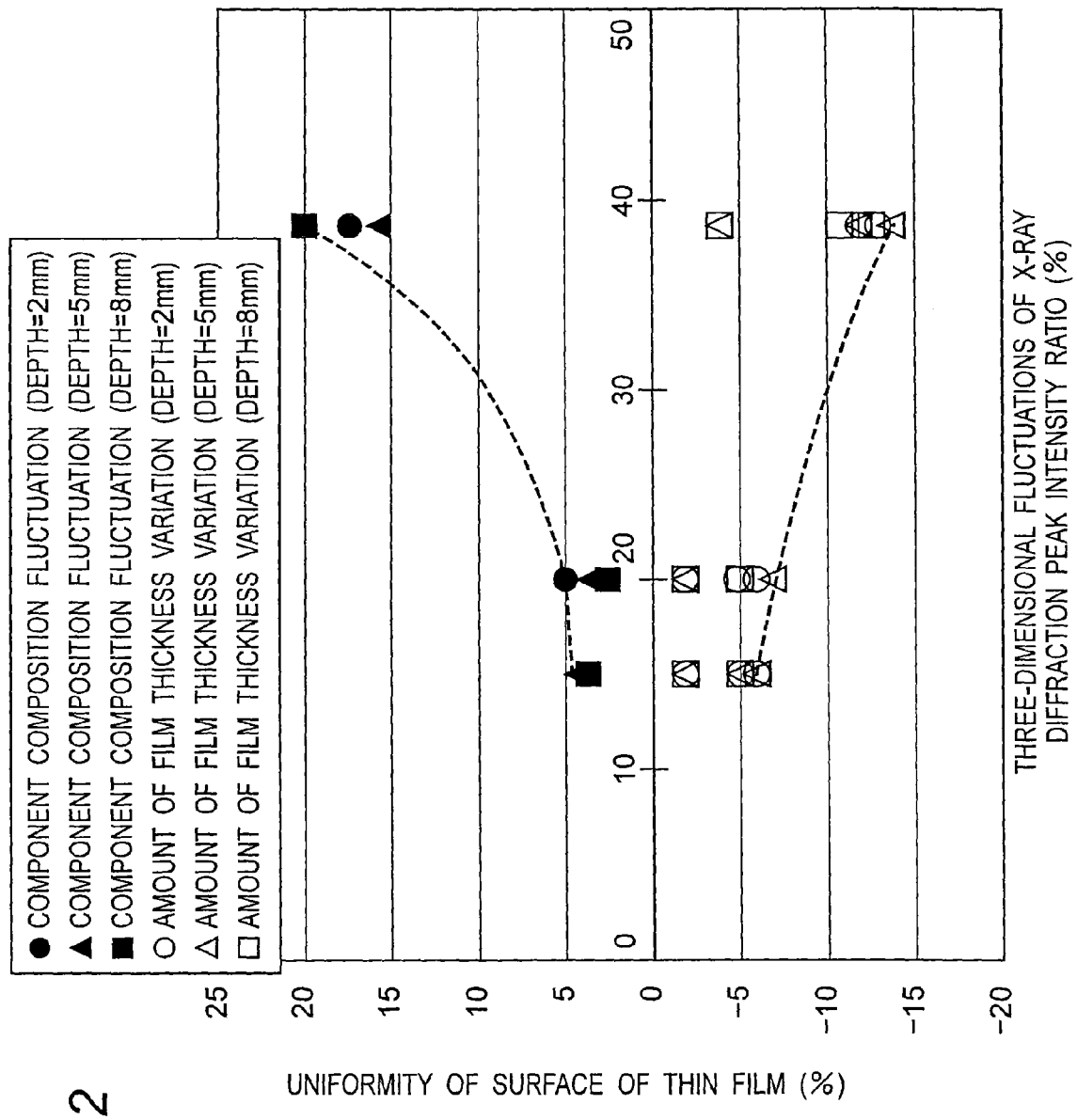
FIG. 2 is a graph showing relationships of three-dimensional fluctuations of X-ray diffraction peak intensity ratios with component composition fluctuations and amount of film thickness variations.

As shown in FIGS. 1 and 2, the component composition fluctuation and the amount of film thickness variation becomes large when the three-dimensional fluctuation of grain sizes reaches the level of approximately 20% and when the three-dimensional fluctuation of X-ray diffraction peak intensity ratios reaches the level of approximately 40% irrespective of the depth position of the sputtering surface. Specifically, the fluctuation of component composition reached the level of approximately 20%, and the amount of film thickness variation reached the level of approximately −14%. In contrast, when suppressing the three-dimensional fluctuations of the grain sizes and the three-dimensional fluctuation of the X-ray diffraction peak intensity ratios, the fluctuation of component composition and the amount of film thickness variation is reduced irrespective of the depth position of the sputtering surface.

The smaller the three-dimensional fluctuations of the grain size and the X-ray diffraction peak intensity ratio are preferable. Suitable settings of these three-dimensional fluctuations can be made corresponding to the target characteristics of the thin film. For example, the three-dimensional fluctuation of the grain sizes is set approximately 18% or less, preferably approximately 15% or less, more preferably approximately 10% or less (for example, approximately 9% or less), and in particular approximately 8% or less. The lower limit is not particularly limited, and, for example, may be approximately 3%.

Further, the three-dimensional fluctuation of the X-ray diffraction peak intensity ratios is set approximately 35% or less, preferably approximately 30% or less, more preferably approximately 20% or less (for example, approximately 17% or less), and in particular approximately 15% or less. The lower limit is not particularly limited, and, for example, may be approximately 5%.

The three-dimensional fluctuation of the grain sizes is determined as follows. First, a plurality of sputtering surfaces are exposed by slicing the sputtering target into planes parallel to the sputtering surface; a plurality of locations on each of the exposed sputtering surfaces are selected; and then the crystal gain sizes at all the selected locations of all the sputtering surfaces are measured. Further, the three-dimensional fluctuation can be more accurately determined by exposing many sputtering surfaces, and normally sputtering surfaces are exposed at thickness intervals of 2 to 3 mm. Furthermore, the three-dimensional fluctuation can be more accurately determined by selecting many locations on each sputtering surfaces, and normally approximately 1.0 to 1.5 locations per 10000 mm$^2$ of sputtering surface are selected.

The grain size is measured according to the following steps of procedure 1) to 4).

Step 1) An optical micrograph of the selected location is taken. A magnification of a microscope may be suitably set according to the grain size. The optimum microscope magnification will be described later, but normally the microscope magnification is set to approximately 50 to 500.

Figure 3:
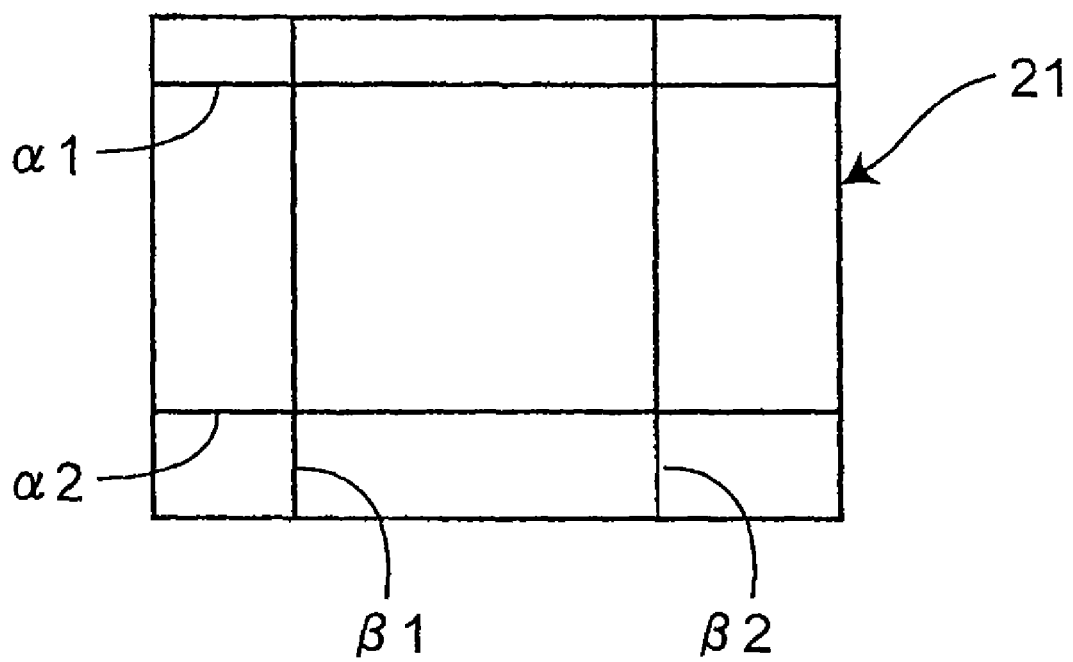
FIG. 3 is a schematic view for explaining an example of a method for measuring grain size.

Step 2) Four or more straight lines are drawn in a grid pattern or lattice shape on the obtained micrograph 21 (refer to FIG. 3). In detail, two mutually parallel straight lines α1, α2 extending horizontally on the diagram are drawn, and two straight lines β1 and β2 extending vertically and orthogonal to the straight lines α1, α2 are drawn. The greater the number of straight lines is, the more accurately the three-dimensional fluctuation can be measured.

Step 3) The number n of grain boundaries on the straight lines in question is investigated, and a grain size d (units: μm) is calculated.

$$d=L/(n \cdot m)$$

(In the formula, L indicates a length of the straight line on the micrograph 21; n indicates the number of grain boundaries on the straight line; and m indicates the magnification of the optical micrograph.)

Step 4) The average value of the grain sizes d derived respectively from these multiple straight lines is taken as the grain size D at the selected location. Taking the average values of the grain sizes corresponding to the straight lines α1, α2, β1, and β2 to be d1, d2, d3, and d4, the grain size D of the selected location is expressed by the following formula.

$$D=(d1+d2+d3+d4)/4$$

Then, the following values A1 and B1 are calculated based on the grain size (numeric value) at all the locations, and the larger of these values A1 and B1 is taken to be the three-dimensional fluctuation of the grain sizes.

$$A1=(D_{max}-D_{ave})/D_{ave} \times 100(\%)$$

$$B1=(D_{ave}-D_{min})/D_{ave} \times 100(\%)$$

(In the formula, $D_{max}$ indicates the largest grain size of all selected locations; $D_{min}$ indicates the smallest value; and $D_{ave}$ indicates the average value.)

The optimum microscope magnification "m" satisfies the following conditions. Specifically, when drawing the straight lines on the micrograph and investigating the number of grain boundaries in the steps 2) and 3), the optimum is to set the microscope magnification "m" such that the number n of grain boundaries per straight line length L=100 mm is approximately 20. For example, if the average grain size $D_{ave}$ is approximately 10 μm, the optimum microscope magnification "m" is approximately 200 to 500; if the average grain size $D_{ave}$ is approximately 20 μm, the optimum microscope magnification "m" is approximately 100 to 400; and if the average grain size $D_{ave}$ is approximately 100 μm, the optimum microscope magnification "m" is approximately 50 to 100. If the average grain size $D_{ave}$ exceeds approximately 100 μm, the microscope magnification "m" may be 50.

Further, the three-dimensional fluctuation of the X-ray diffraction peak intensity ratios ($X_2/X_1$) is determined in the following manner.

First, in the same way as with the aforementioned grain size, a plurality of measurement locations are selected on each of the multiple sputtering surfaces. Then, the X-ray diffraction peak intensity (counts per second) of the Ag of all the selected locations is measured for each selected location, and the ratio ($X_2/X_1$) of the largest Ag X-ray diffraction peak intensity $X_1$ in relation to the second largest Ag X-ray diffraction peak intensity $X_2$ is calculated. The same values as when calculating the grain size are calculated based on the X-ray diffraction peak intensity ratios (numeric values) for all the locations (specifically, the following values A2 and B2 are calculated), and the larger of these values A2 and B2 is taken as the three-dimensional fluctuation of the X-ray diffraction peak intensity ratios.

$$A2=(R_{max}-R_{ave})/R_{ave} \times 100(\%)$$

$$B2=(R_{ave}-R_{min})/R_{ave} \times 100(\%)$$

[In the formula, $R_{max}$ indicates the maximum value of the X-ray diffraction peak intensity ratios ($X_2/X_1$) at all selected locations; $R_{min}$ indicates the minimum value; and $R_{ave}$ indicates the average value.]

In the Ag sputtering target of the present invention, the smaller the average grain size $D_{ave}$ and/or the maximum grain size $D_{max}$ is preferable. The smaller these values are, the more the uniformity of the thin film thickness and component composition (uniformity across the film surface, and continuous uniformity in the film formation process) can be improved.

The average grain size $D_{ave}$ is, for example, 100 μm or less, preferably 50 μm or less, more preferably 30 μm or less, and in particular 20 μm or less. The maximum grain size $D_{max}$ is, for example, 120 μm or less, preferably 70 μm or less, more preferably 40 μm or less, and in particular, 25 μm or less.

The shape of the sputtering target is not particularly limited, and can be any well-known type of shape, but a disk-like shape is particularly preferable. In such kind of disk-like shaped sputtering target, the grain size and/or crystal grain orientation (X-ray diffraction peak intensity ratio) is evenly uniform both across the surface of the disk (sputtering surface) and throughout the plate thickness. Then, if the grain size and/or crystal grain orientation is uniform across the disk surface, irradiation distributions of the Ag sputtered (and alloy element as well in case of the Ag alloy) become uniform, thereby achieving preferable uniformity of the thickness (and component composition as well in case of the Ag alloy) of the Ag thin film formed on the substrate across the film surface. Further, because the grain size and/or crystal grain orientation is uniformly even throughout the plate thickness, the Ag thin film with superior uniformity of thickness (and component composition as well in case that the Ag alloy) across the film surface can be stably formed continuously from beginning to end of usage of the Ag sputtering target.

The sputtering target of the present invention is not particularly limited in terms of the Ag component, and may be a pure Ag sputtering target or an Ag alloy sputtering target. In particular, if the Ag alloy contains rare-earth metals, the present invention provides the following kinds of effects. Specifically, the Ag alloy sputtering target can be produced, for example, by melting and casting Ag compounded with alloy elements to obtain an ingot, and then rolling and forging and like the obtained ingot. In this regard, because rare-earth metals tend to be easily oxidized, oxides of the rare-earth metals are easily produced on the surface of the ingot. Then, when rolling the ingot, if the oxides in question are not completely cut off and removed prior to rolling, then the oxides will be embedded in the rolled surface (the surface equivalent to the sputtering surface of the sputtering target). When thin films are formed using the sputtering target with the embedded oxides, impurities from the oxides are mixed into the thin film, casing defects such as peeling, clumping and like. However, in the present invention, because a special processing method described later is adopted, even if the oxides of rare-earth metals cannot be completely eliminated prior to producing a sputtering target, the embedding of oxides on the sputtering surface can be reduced.

The rare-earth materials include Sc, Y, and lanthanoids (La, Ce, Pr, Nd, Pm, Sm, Eu, Gd, Tb, Dy, Ho, Er, Tm, Yb, Lu) and like. For example, content of the rare-earth metal is approximately 5 atomic percent or less (not including 0 atomic percent), preferably, 3 atomic percent or less, and more preferably 1 atomic percent or less.

Further, the Ag alloy sputtering target may be a two element system (for example, two elements comprising Ag and a rare-earth metal), or a three or more element system [for example, a three element system comprising Ag, a rare-earth metal, and another metal (for example, Cu)].

The thickness of the Ag sputtering target is not particularly limited, and for example is approximately 3 to 35 mm, with about 5 to 30 mm being common.

Figure 4A:
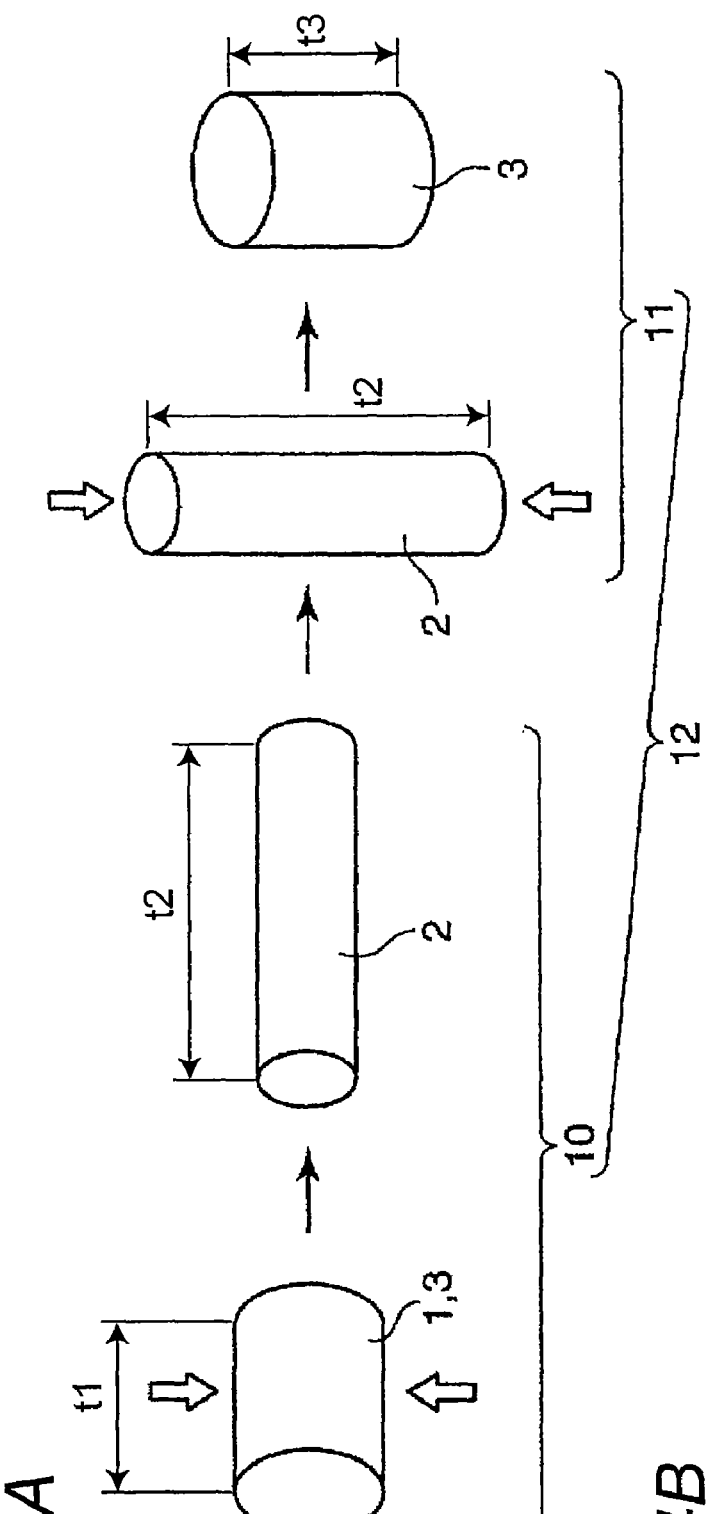
FIGS. 4A and 4B are schematic views for explaining an example of a method for producing a sputtering target of the present invention.
Figure 4B:
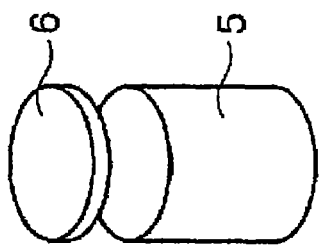

Then, a method for producing the Ag sputtering target of the present invention will be explained referring to FIG. 4. In the illustrated method, a columnar Ag ingot 1 obtained by melting and casting Ag (or Ag alloy) is elongated in a axial direction thereof by hot solid forging 10, and a solid forged mass 2 obtained by the solid forging maintains a columnar shape. Subsequently, the solid forged mass 2 is compressed in the axial direction by hot upsetting 11, and a compressed body 3 obtained by the upsetting still maintains a columnar shape. After conducting forging operation including the solid forging operation 10 followed by the upsetting operation 11 (FIG. 4(A)) one or more times while hot, the forging operation 12 is conducted once or more times while cold. After heat treatment, the Ag sputtering target 6 is produced by slicing the columnar shaped cold processed body 5 into rounds as indicated in FIG. 4(B).

This method for production achieves reduction of the three-dimensional fluctuation of the grain size and the three-dimensional fluctuation of the X-ray diffraction peak intensity ratios, as well as reduction of the average grain size $D_{ave}$ and maximum grain size $D_{max}$. Further, because the cold processed columnar mass is sliced into rounds, the sputtering targets can be produced with better yield comparing to the case where disks are stamped out from a plate-shaped processed mass. Further, in view of the kerf loss when cutting into rounds, making the plate thickness of the sputtering target thicker to a certain extent (for example, 10 mm or more) has the effect of improving the yield.

In the previously described production process, heat treatment after one or more sets of cold forging which includes the solid forging and upsetting especially contributes to the reduction of the three-dimensional fluctuations of the grain sizes and X-ray diffraction peak intensity ratios. By the cold forging which includes the solid forging and upsetting, processing strain is uniformly introduced to the cold processed columnar mass, resulting in that the cold processed columnar mass can be uniformly re-crystallized by the heat treatment.

The cold forging with the solid forging and upsetting become more effective as a forging ratio defined by the following formula becomes greater. Specifically, the greater the forging ratio is, the more the three-dimensional fluctuations of the grain sizes and X-ray diffraction peak intensity ratios can be reduced, and the more the grain size itself (the average grain size $D_{ave}$, maximum grain size $D_{max}$ and like) can be decreased. Symbols used in the following formula are indicated in FIG. 4.

Forging ratio=(Forging ratio of solid forging×Forging ratio of upsetting)

Forging ratio of elongation=Length "t2" after axial solid forging of columnar processed mass/Length "t1" prior to solid forging Forging ratio of upsetting=Length "t2" prior to axial upsetting of cylindrical process body/Length "t3" after upsetting In case that multiple sets of forging including solid forging and upsetting are conducted, the total forging ratio is derived by multiplying together all the forging ratios derived for each set.

The forging ratio (total forging ratio if conducting multiple sets of cold forging comprising solid forging and upsetting) can be selected from the range of, for example, approximately 1 to 10, preferably approximately 2 to 9, and more preferably approximately 3 to 8.

The number of repetitions of cold forging comprising the solid forging and upsetting is not particularly limited, and may be once or plural times. In view of heightening the forging ratio, many repetitions are preferably.

The heating temperature during the hot forging can be selected from the range normally selected, and for example, approximately 500 to 750° C. is preferable. The temperature during the heat treatment can be selected, for example, from the range of approximately 500 to 600° C., with approximately 520 to 580° being preferable.

The Ag sputtering target of the present invention is adopted in any sputtering method such as DC sputtering, RF sputtering, magnetron sputtering, or reactive sputtering, and useful in forming an Ag thin film with a thickness of approximately 2 to 500 nm.

The obtained thin film has uniformity in both the film thickness and component composition across the film surface. Thus, the thin film can be used, for example, as semi-transparent reflective film or reflective film for optical information media such as DVDs, achieving enhanced signal read/write performance.

EMBODIMENTS

The present invention will be more specifically described below by citing embodiments, but the present invention is, of course, not limited to the embodiments below, and suitable modifications can naturally be implemented within the range of the previous and subsequent descriptions. All of these modifications are encompassed in the technical scope of the present invention.

1) Sputtering Target

Properties of sputtering targets (thickness 10 mm) obtained in the following examples were measured by following methods.

[Grain Size]

Optical micrographs of the sputtering surface of the sputtering targets were taken (in experimental examples 1, 4, and 7, the magnification was 200, in the other experimental examples, the magnification was 50) followed by that four straight lines α1, α2, β1, β2 were drawn on the obtained micrographs obtained in a grid pattern as indicated in FIG. 3. Subsequently, the number "n" of grain boundaries on the straight lines was investigated, and then the grain sizes "d" (unit: μm) were calculated for each straight line based on the following formula.

$$d = L/(n \cdot m)$$

(In the formula, "L" indicates the length of the straight line; "n" indicates the number of grain boundaries on the straight line; and "m" indicates the magnification of the optical micrograph.)

The average value of the grain sizes "d" derived respectively from these multiple straight lines α1, α2, β1, and β2 were taken as the grain size D of the optical micrograph (measurement location).

[X-Ray Diffraction Peak Intensity Ratio]

The sputtering surfaces of the sputtering targets were analyzed by x-ray diffraction under the conditions indicated below in order to measure the Ag X-ray diffraction peak intensities [X-ray diffraction peak intensities the (111) plane, (200) plane, (220) plane, (311) plane, (222) plane, (400) plane and like. Units: counts per second].

The ratio ($X_2/X_1$) of the largest intensity $X_1$ of these X-ray diffraction peaks in relation to the second largest intensity $X_2$ was taken as the X-ray diffraction peak intensity ratio.

X-Ray Diffraction Conditions

A) Preprocessing of Test Pieces

Preprocessing was not conducted in these experimental examples because the surfaces of the test pieces were smooth (if desiring to eliminate the effect of cut strain on the surface of the test piece, it is preferable to polish the surface under wet condition and then etch it with dilute nitric acid).

b) Analytic Apparatus

"RINT1500" Manufactured by Rigaku Denki Co., Ltd.

c) Analytic Conditions

Target: Cu

Monochromatic: CuK α-rays using a monochromator

Target output: 50 kV-200 mA

Slit: Divergence 1°, scattering 1°, receiving 0.15 mm

Scanning speed: 4°/min

Sampling width: 0.02°

Measurement range (2θ): 10 to 130°

[Three-Dimensional Fluctuation of Grain Sizes]

A disk-like shaped sputtering target with a thickness of 10 mm was sliced into rounds at depths of 2 mm, 5 mm, and 8 mm from an end surface. A total of twelve locations were selected by selecting four uniformly distributed locations for each cut surface without deviation, and the grain size of each location was determined in the above-mentioned. Then, the largest of the obtained values was taken as the $D_{max}$, the smallest as the $D_{min}$, and the average value as the $D_{ave}$, followed by that the values A1 and B1 below were calculated and then the larger of these values A1 and B1 was taken as the three-dimensional fluctuation of the grain sizes.

$$A1=(D_{max}-D_{ave})/D_{ave}\times100(\%)$$

$$B1=(D_{ave}-D_{min})/D_{ave}\times100(\%)$$

[Three-Dimensional Fluctuation of the X-Ray Diffraction Peak Intensity Ratios]

Twelve locations were selected in the same way as for the three-dimensional fluctuation of the grain sizes, and the X-ray diffraction peak intensity ratios ($X_2/X_1$) of the respective locations were determined as described above. Then, the largest of the obtained values was taken as the $R_{max}$, the smallest as the $R_{min}$, and the average value as the $R_{ave}$, followed by that the values A2 and B2 below were calculated and then the larger of these values A2 and B2 was taken as the three-dimensional fluctuation of the X-ray diffraction peak intensity ratios.

$$A2=(R_{max}-R_{ave})/R_{ave}\times100(\%)$$

$$B2=(R_{ave}-R_{min})/R_{ave}\times100(\%)$$

2) Thin Film

Using the sputtering target obtained in experimental example, thin films (film thickness: 100 nm) were formed by DC magnetron sputtering (base pressure: $2.0\times10^{-6}$ Torr or less ($2.7\times10^{-4}$ Pa or less), Ar gas pressure: 2.0 mTorr (0.27 Pa), sputtering power: 1000 W, distance between target and substrate: 55 mm, thin film formation substrate: glass substrate (diameter 120 mm, thickness 1 mm) substrate temperature: room temperature). As described above, because the sputtering target was sliced at specified depths (2 mm, 5 mm, and 8 mm in the experimental example) in order to investigate the three-dimensional fluctuations of the grain sizes and the X-ray diffraction peak intensity ratios, three sputtering targets having surfaces corresponding to the specified depths were used respectively to form thin films, and the characteristics of the obtained thin films were evaluated as follows.

[Fluctuations of Component Composition Across the Film Surface]

(I) Three thin films (diameter: 120 mm) obtained from sputtering targets at the depths of 2 mm, 5 mm, and 8 mm from the initial sputtering surface were analyzed using an X-ray micro-analyzer under the following conditions, and the film surface distribution of the alloy element (Nd, etc.) content was investigated.

X-Ray Micro-Analyzer Conditions a) Preprocessing of Test Piece

The test piece was embedded in resin, and the surface for analysis was polished under wet condition.

b) Analytic Apparatus

"EPMA (WD/ED combined micro-analyzer) JXA-8900RL" manufactured by JELO Ltd c) Analytic Conditions Format: Stage scan Acceleration voltage: 15 kV Irradiation current: 0.2 µA Beam diameter: 1 µm Time: 100 ms Number of points: 400×400

Distance: A: 1.5 µm, Y: 1.5 µm (II) Fluctuation of component composition across the film surface of each thin film was evaluated as follows. Specifically, five locations were selected without deviation from the thin film (locations along the diameter at 10 mm, 30 mm, 60 mm, 90 mm and 110 mm from the edge were selected on the 120 mm diameter disk-like shaped thin films of the experimental example], and the content of the alloy elements (such as Nd) at each location was determined. Then, the largest of the obtained values was taken as the $C_{max}$, the smallest value as the $C_{min}$, and the average value as the $C_{ave}$, followed by that the values A3 and B3 below were calculated and then the larger of these values A3 and B3 was taken as the three-dimensional fluctuation of the component composition across the film surface.

$$A3=(C_{max}-C_{ave})/C_{ave}\times100(\%)$$

$$B3=(C_{ave}-C_{min})/C_{ave}\times100(\%)$$

[Fluctuation of Film Thicknesses Across the Film Surface]

The respective film thickness of three thin films (diameter: 120 mm) obtained from depths of 2 mm, 5 mm, and 8 mm from the initial sputtering surface were measured, and the fluctuations of each thin film across the film surface were determined by the following manner.

Specifically, five locations were selected without deviation from the thin film (locations along the diameter at 10 mm, 30 mm, 60 mm, 90 mm and 110 mm from the edge were selected on the 120 mm diameter disk-like shaped thin films of the experimental example), and film thicknesses of the various locations were measured by a step-type film thickness meter. The measured value at a center (location 60 mm from the edge) was taken as the $T_{center}$, the measured values of other locations "n" were taken as $T_n$, and the amount of variation ($\Delta T_n$) of the other locations "n" were calculated by the following formula.

$$\Delta T_n=(T_n-T_{center})/T_{center}\times100(\%)$$

Experimental Example 1

An Ag-0.5 atomic percent Nd alloy ingot was produced by induction melting Ag compounded with Nd under Ar atmosphere and casting it (cooling rate: 0.1 to 1° C./second) into a columnar shape using a mould. The obtained columnar ingot was subject to one time of hot forging including tap solid forging 10 (temperature: 700° C., forging ratio: 1.4) and upsetting 11 (temperature: 700° C., forging ratio: 1.4) as indicated in FIG. 4(A) and then heat treatment (temperature: 550° C., time: 1.5 hr). Further, the columnar ingot was subject to three times of cold forging 12 $(1.4 \times 1.4)^3 = 7.5$) including tap solid forging 10 (forging ratio: 1.4) and upsetting 11 (forging ratio: 1.4) and then heat treatment (temperature: 550° C., time: 1.5 hr). The obtained columnar cold processed body 5 was sliced into rounds as indicated in FIG. 4(B) and then subject to finish machining, resulting in that disk-like shaped (diameter 200 mm, thickness 10 mm) Ag-0.5 atomic percent Nd alloy sputtering targets were produced.

Experimental Example 2

The same procedures were conducted as in the experimental example 1 except that the number of repetitions of cold forging comprising tap solid forging and upsetting was two [forging ratio: $1.4 \times 1.4]^2 = 3.8$].

Experimental Example 3

Figure 5A:
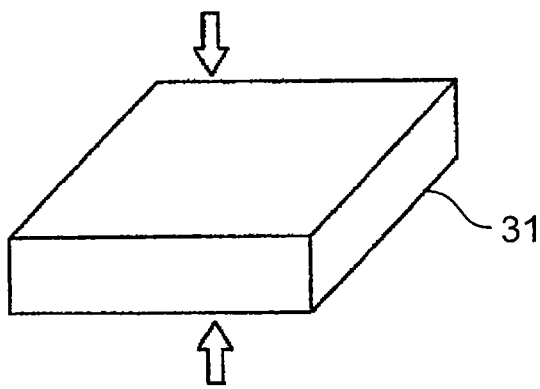
FIGS. 5A, 5B, and 5C are schematic perspective views for explaining a method for producing a sputtering target of experimental example 3.
Figure 5B:
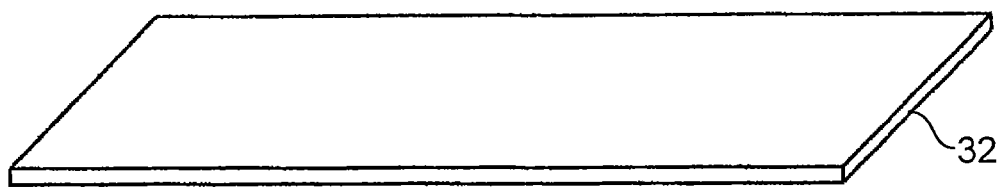
Figure 5C:
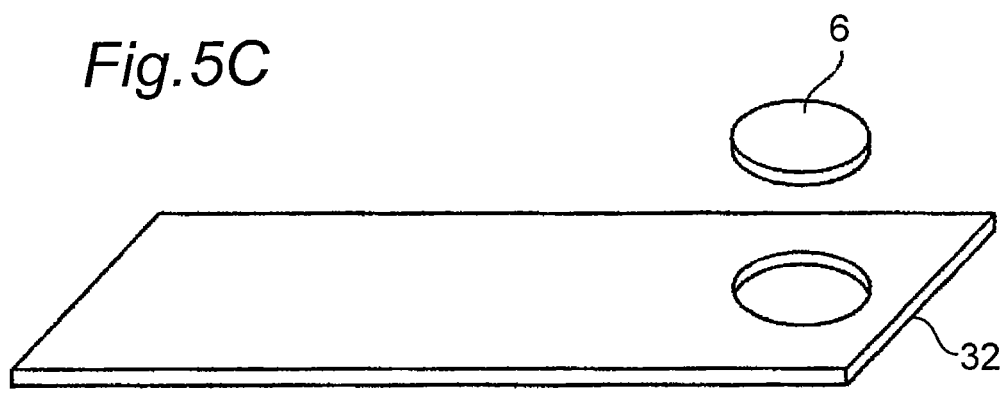

The procedures of experimental example 3 will be explained referring to FIG. 5. Specifically, an Ag-0.5 atomic percent Nd alloy ingot 31 (refer to FIG. 5(A)) was produced by induction melting Ag compounded with Nd under Ar atmosphere and casting it (cooling rate: 0.5 to 1° C./second) into a rectangular column shape using a mould. A rolled plate 32 (refer to FIG. 5(B)) was produced by hot rolling (temperature: 650° C., roll reduction: 40%) the rectangular column-shaped ingot 31, cold rolling (roll reduction: 50%), and heat treatment (temperature: 550° C., time: 1.5 hr). Disk-like shaped (diameter 200 mm, thickness 10 mm) Ag-0.5 atomic percent Nd alloy sputtering targets 6 were produced by stamping out disks from the rolled plate 32 (refer to FIG. 5(C)) and finish machining the disks.

The results of measuring the properties of the sputtering targets obtained in experimental examples 1 to 3 as well as the results of evaluating thin film formed using these sputtering targets are indicated in the following Tables 1 to 3, and FIGS. 1 and 2. Experimental examples 1 and 2 are embodiments of the present invention, and experimental example 3 is a comparative example.

TABLE 1

| | | Sputtering target | | | | | | | |
|---|---|---|---|---|---|---|---|---|---|
| Example | Depth from initial sputtering surface (mm) | Grain size D (µ) -Measured value- | | | | X-ray diffraction peak intensity ratio $(X_2/X_1)$ -Measured result- | | | |
| 1 | 2 | 17.2 | 16.5 | 17.9 | 17.6 | 0.23 | 0.21 | 0.18 | 0.20 |
|   | 5 | 16.9 | 17.4 | 18.2 | 16.7 | 0.19 | 0.21 | 0.19 | 0.22 |
|   | 8 | 17.2 | 17.8 | 16.7 | 18.8 | 0.22 | 0.19 | 0.21 | 0.20 |
| 2 | 2 | 79.2 | 76.2 | 78.5 | 84.0 | 0.24 | 0.23 | 0.20 | 0.21 |
|   | 5 | 92.3 | 83.2 | 90.3 | 77.5 | 0.18 | 0.16 | 0.20 | 0.22 |
|   | 8 | 78.4 | 86.2 | 89.3 | 91.5 | 0.22 | 0.19 | 0.22 | 0.16 |
| 3 | 2 | 86.9 | 68.3 | 74.8 | 80.2 | 0.39 | 0.42 | 0.46 | 0.61 |
|   | 5 | 95.6 | 96.2 | 78.2 | 83.7 | 0.52 | 0.42 | 0.34 | 0.48 |
|   | 8 | 72.5 | 69.1 | 82.4 | 95.8 | 0.34 | 0.45 | 0.41 | 0.48 |

TABLE 2

| | | Characteristics of thin film obtained -Measured values- | | | | | | | | | |
|---|---|---|---|---|---|---|---|---|---|---|---|
| | | Film thickness (nm) | | | | | Component composition: Content [atomic percent] of alloy element (Nd) | | | | |
| Example | Depth from initial sputtering surface (mm) | Distance from edge 10 mm | Distance from edge 30 mm | Distance from edge 60 mm | Distance from edge 90 mm | Distance from edge 110 mm | Distance from edge 10 mm | Distance from edge 30 mm | Distance from edge 60 mm | Distance from edge 90 mm | Distance from edge 110 mm |
| 1 | 2 | 99 | 103 | 105 | 103 | 100 | 0.48 | 0.51 | 0.52 | 0.50 | 0.49 |
|   | 5 | 98 | 101 | 103 | 101 | 97 | 0.48 | 0.51 | 0.51 | 0.49 | 0.47 |
|   | 8 | 97 | 100 | 102 | 100 | 96 | 0.49 | 0.50 | 0.50 | 0.52 | 0.50 |
| 2 | 2 | 103 | 106 | 108 | 106 | 102 | 0.47 | 0.49 | 0.51 | 0.51 | 0.49 |
|   | 5 | 96 | 101 | 103 | 101 | 97 | 0.48 | 0.49 | 0.52 | 0.51 | 0.51 |
|   | 8 | 95 | 99 | 101 | 99 | 96 | 0.47 | 0.49 | 0.50 | 0.50 | 0.48 |
| 3 | 2 | 90 | 98 | 102 | 98 | 89 | 0.38 | 0.41 | 0.51 | 0.45 | 0.42 |
|   | 5 | 89 | 99 | 103 | 99 | 91 | 0.40 | 0.44 | 0.50 | 0.43 | 0.39 |
|   | 8 | 94 | 101 | 105 | 101 | 92 | 0.40 | 0.45 | 0.52 | 0.42 | 0.38 |

TABLE 3

| Example | Sputtering target | | | | | Thin film | | | |
|---|---|---|---|---|---|---|---|---|---|
| | Depth from the initial sputtering surface (mm) | Grain size D | | X-ray diffraction peak intensity ratio ($X_2/X_1$) | | Film thickness Amount of variation $\Delta T_n$ across film surface <n = 10 mm, 30 mm, 90 mm, 110 mm> (%) | Component Composition (Nd) | |
| | | Average $D_{ave}$ (μ) | Three-dimentional fluctuations (%) | Average $R_{ave}$ | Three-dimentional fluctuations (%) | | Average $C_{ave}$ (atomic %) | Fluctuations across film surface (%) |
| 1 | 2 | 17.4 | 8 | 0.20 | 15 | −5.7, −1.9, −1.9, −4.8 | 0.50 | 4.0 |
| | 5 | | | | | −4.9, −1.9, −1.9, −5.8 | 0.49 | 4.5 |
| | 8 | | | | | −4.9, −2.0, −2.0, −5.9 | 0.50 | 3.6 |
| 2 | 2 | 83.9 | 10 | 0.20 | 20 | −4.6, −1.9, −1.9, −5.6 | 0.49 | 4.9 |
| | 5 | | | | | −6.8, −1.9, −1.9, −5.8 | 0.50 | 3.6 |
| | 8 | | | | | −5.9, −2.0, −2.0, −5.0 | 0.49 | 2.5 |
| 3 | 2 | 80.2 | 20 | 0.44 | 39 | −11.8, −3.9, −3.9, −12.7 | 0.43 | 17.5 |
| | 5 | | | | | −13.6, −3.9, −3.9, −11.7 | 0.43 | 15.7 |
| | 8 | | | | | −10.5, −3.8, −3.8, −12.4 | 0.43 | 19.8 |

As apparent from table 3, the production method of the sputtering target of example 3 (comparative example) was not adequate, resulting in that the three-dimensional fluctuation of grain sizes was large at 20%, and the three-dimensional fluctuation of X-ray diffraction peak intensity ratios was also large at 39%. Therefore, the amount of variation (ΔTn) of the maximum film thicknesses of the obtained thin films was large, i.e., −12.7% (depth=2 mm), −13.6% (depth=5 mm), and −12.4% (depth=8 mm). Further, the fluctuation of component composition was also large, i.e., 17.5% (depth=2 mm), 15.7% (depth=5 mm), and 19.8% (depth=8 mm).

Contrary to this, the sputtering targets of examples 1 and 2 (embodiments of the present invention) were manufactured by adequate method, resulting in that the three-dimensional fluctuations of the grain sizes were small, and the three-dimensional fluctuations of the X-ray diffraction peak intensity ratios were also small. Therefore, irrespective of the depth from the initial sputtering surface, the obtained thin films had little variation of film thickness across the film surface, and small fluctuations of component composition across the film surface. This means that a thin film with uniform thickness and component composition across the film surface can be stably obtained continuously from beginning to end of usage of the sputtering target. Further, the amount of variation of film thickness across the film surface and the fluctuations of component composition across the film surface were notably reduced compared to experimental example 3.

Especially, because the forging ratio when cold forging in experimental example 1 was set to a adequate range, the grain size values and three-dimensional fluctuation thereof was small, and the three-dimensional fluctuation of the X-ray diffraction peak intensity ratios was smaller, resulting in that the variation of fluctuations of film thickness and component composition caused by differences in depth from the initial sputtering surface is further suppressed (refer to FIGS. 1, 2).

Experimental Examples 4 to 6

The same procedures as those in the experimental examples 1 to 3 were adopted except that Ag-0.7 atomic percent Nd-0.9 atomic percent Cu alloy ingot was used instead of Ag-0.5 Nd atomic percent alloy ingot. Experimental example 4 is a modification of the experimental example 1; experimental example 5 is a modification of the experimental example 2; and experimental example 6 is a modification of experimental example 3. Thus, the experimental examples 4 and 5 are embodiments of the present invention, and the experimental example 6 is a comparative example.

The results of measurements and evaluations are indicated in Table 4.

TABLE 4

| Example | Sputtering target | | | | | Thin film | | | | |
|---|---|---|---|---|---|---|---|---|---|---|
| | Depth from the initial sputtering surface (mm) | Grain size D | | X-ray diffraction peak intensity ratio ($X_2/X_1$) | | Film thickness Amount of variation $\Delta T_n$ across film surface <n = 10 mm, 30 mm, 90 mm, 110 mm> (%) | Component Composition | | | |
| | | | | | | | Nd | | Cu | |
| | | Average $D_{ave}$ (μ) | Three-dimentional fluctuations (%) | Average $R_{ave}$ | Three-dimentional fluctuations (%) | | Average $C_{ave}$ (atomic %) | Fluctuations across film surface (%) | Average $C_{ave}$ (atomic %) | Fluctuations across film surface (%) |
| 4 | 2 | 15.6 | 7 | 0.19 | 15 | −4.8, −2.0, −2.0, −4.5 | 0.69 | 2.2 | 0.91 | 2.8 |
| | 5 | | | | | −5.2, −1.9, −1.9, −4.7 | 0.68 | 3.2 | 0.90 | 3.3 |
| | 8 | | | | | −5.3, −1.9, −1.9, −4.9 | 0.71 | 2.9 | 0.88 | 3.1 |
| 5 | 2 | 78.9 | 10 | 0.20 | 18 | −5.2, −2.0, −2.0, −5.0 | 0.70 | 3.8 | 0.89 | 3.5 |
| | 5 | | | | | −5.1, −1.9, −1.9, −4.8 | 0.71 | 3.3 | 0.90 | 3.2 |
| | 8 | | | | | −5.6, −2.1, −2.1, −5.4 | 0.69 | 4.1 | 0.90 | 3.9 |
| 6 | 2 | 82.4 | 21 | 0.35 | 38 | −11.3, −3.5, −3.6, −10.9 | 0.64 | 13.4 | 0.83 | 12.5 |
| | 5 | | | | | −13.5, −3.6, −3.6, −11.4 | 0.62 | 14.6 | 0.84 | 14.2 |
| | 8 | | | | | −12.9, −3.8, −3.7, −12.7 | 0.64 | 15.2 | 0.83 | 18.3 |

The sputtering targets of the experimental example 6 (comparative example) had large three-dimensional fluctuations of the grain sizes and X-ray diffraction peak intensity ratio, and therefore the obtained thin films also had large variations of film thickness across the film surface and large fluctuation of component composition across the film surface.

Contrary to this, the sputtering targets of experimental examples 4 and 5 (embodiments of the present invention) had small three-dimensional fluctuations of the grain size and X-ray diffraction peak intensity ratio, and therefore, the obtained thin films had little variation of film thickness across the film surface, and small fluctuation of component composition across the film surface. Thus, a thin film with uniform thickness and component composition across the film surface can be stably obtained continuously from beginning to end of usage of the sputtering target.

Experimental Examples 7 to 9

The same procedures as those in the experimental examples 1 to 3 above were followed except that pure Ag ingot was used instead of Ag-0.5 atomic percent Nd alloy ingot. Experimental example 7 is a modification of the experimental example 1; experimental example 8 is a modification of the experimental example 2; and experimental example 9 is a modification of the experimental example 3.
The results of measurements and evaluations are indicated in Table 5.

TABLE 5

| | Sputtering target | | | | | Thin film |
|---|---|---|---|---|---|---|
| | Depth from the initial sputtering | Grain size D | | X-ray diffraction peak intensity ratio ($X_2/X_1$) | | Film thickness Amount of variation $\Delta T_n$ across film surface |
| Example | surface (mm) | Average $D_{ave}$ ($\mu$) | Three-dimensional fluctuations (%) | Average $R_{ave}$ | Three-dimentional fluctuations (%) | <n = 10 mm, 30 mm, 90 mm, 110 mm> (%) |
| 7 | 2 | 23.5 | 12 | 0.20 | 18 | −5.4, −2.2, −2.1, −5.1 |
|   | 5 |      |    |      |    | −5.6, −2.0, −1.9, −4.8 |
|   | 8 |      |    |      |    | −5.7, −2.1, −2.2, −5.0 |
| 8 | 2 | 88.6 | 14 | 0.22 | 23 | −5.6, −2.1, −2.0, −5.0 |
|   | 5 |      |    |      |    | −5.3, −2.0, −2.2, −4.9 |
|   | 8 |      |    |      |    | −5.9, −2.1, −2.2, −5.3 |
| 9 | 2 | 104.7 | 26 | 0.51 | 43 | −13.8, −3.8, −4.0, −14.5 |
|   | 5 |       |    |      |    | −14.8, −3.6, −3.9, −13.7 |
|   | 8 |       |    |      |    | −14.5, −4.1, −3.7, −15.1 |

The sputtering targets of experimental example 9 (comparative example) had large three-dimensional fluctuations of the grain sizes and X-ray diffraction peak intensity ratios, and therefore the obtained thin films also had large variations of film thickness across the film surface.

Contrary to this, the sputtering targets of experimental examples 7 and 8 (embodiments of the present invention) had small three-dimensional fluctuations of the grain sizes and X-ray diffraction peak intensity ratios, and therefore, the obtained thin films had little variation of film thickness across the film surface, and thus thin film with uniform thickness across the film surface can be stably obtained continuously from beginning to end of usage of the sputtering target.

Although the present invention has been fully described in conjunction with preferred embodiments thereof with reference to the accompanying drawings, various changes and modifications are possible for those skilled in the art. Therefore, such changes and modifications should be construed as included in the present invention unless they depart from the intention and scope of the invention as defined by the appended claims.

The invention claimed is:

1. An Ag sputtering target having a sputtering surface,
wherein the Ag sputtering target has three-dimensional fluctuation of grain sizes not more than 18%; and
wherein the three-dimensional fluctuation of the grain sizes is measured by:
exposing a plurality of layers having additional sputtering surfaces by slicing the Ag sputtering target in planes parallel to a sputtering starting surface,
selecting a plurality of locations on each of the exposed sputtering surfaces of the layers, and
measuring grain sizes D at all the selected locations of all the exposed sputtering surfaces of the layers by executing i) to iv) below,
i) taking an optical micrograph of the selected location,
ii) drawing a plurality of straight lines equal to or more than four in a grid pattern on the obtained micrograph,
iii) investigating a number n of grain boundaries on each of the straight lines, and calculating a grain size d (unit: μm) for each of the straight lines on the basis of the following formula:

$$d = L/(n \cdot m)$$

wherein
L: length of the straight line,
n: number of the grain boundaries on the straight line,
m: magnification of the optical micrograph, and
iv) calculating the grain size D at the selected location as an average value of the grain sizes d for the plurality of straight lines;
calculating values A1 and B1 using the formula below and based on the results of measurement of the grain sizes D at all the selected locations of all the exposed sputtering surfaces:

$$A1 = (D\text{max} - D\text{ave})/D\text{ave} \times 100 (\%)$$

$$B1 = (D\text{ave} - D\text{min})/D\text{ave} \times 100 (\%)$$

wherein
Dmax: maximum value among the grain sizes D at all the selected locations
Dmin: minimum value among the grain sizes D at all the selected locations
Dave: average value of the grain sizes D at all the selected locations; and selecting larger one of the values A1 and B1 as the three-dimensional fluctuation of the grain sizes.

2. The Ag sputtering target according to claim 1, wherein the average grain size Dave is not more than 100 μm, and the maximum grain size Dmax is not more than 120 μm.

3. An Ag sputtering target according to claim 1, having a disc-like shape.

4. An Ag sputtering target according to claim 1, formed by Ag aqlloy containing rare-earth metal.

5. An Ag sputtering target according to claim 4, wherein a content of the rare-earth metal is not more than 5 atomic percent (not including 0 atomic percent).

6. An Ag sputtering target having sputtering surfaces,
wherein the Ag sputtering target has three-dimensional fluctuation of X-ray diffraction peak intensity ratios (X2/X1) not more than 35%; and
wherein the three-dimensional fluctuation of the X-ray diffraction peak intensity ratios (X2/X1) is measured by:
exposing a plurality of layers having additional sputtering surfaces by slicing the Ag sputtering target in planes parallel to a sputtering starting surface;
selecting a plurality of locations on each of the exposed sputtering surfaces of the layers;
measuring the X-ray diffraction peak intensities of the Ag at all the selected locations of all the exposed sputtering surfaces of the layers;
calculating the X-ray diffraction peak intensity ratio (X2/X1) for each of the selected locations, the X-ray diffraction peak intensity ratio (X2/X1) being defined as the ratio of the largest Ag X-ray diffraction peak intensity X1 in relation to the second largest Ag X-ray diffraction peak intensity X2;
calculating values A2 and B2 using the formula below and based on the X-ray diffraction peak intensity ratios (X2/X1) at all the selected locations of all the exposed sputtering surfaces, $$A2 = (R\text{max} - R\text{ave})/R\text{ave} \times 100 (\%)$$

$$B2 = (R\text{ave} - R\text{min})/R\text{ave} \times 100 (\%)$$

wherein
Rmax: maximum value among the X-ray diffraction peak intensity ratios (X2/X1) at all selected locations
Rmin: minimum value among the X-ray diffraction peak intensity ratios (X2/X1) at all selected locations
Rave: average value of the X-ray diffraction peak intensity ratios (X2/X1) at all selected locations; and
selecting the larger one of the values A2 and B1 as the three-dimensional fluctuation of the X-ray diffraction peak intensity ratio (X2/X1).

7. An Ag sputtering target according to claim 6, having a disc-like shape.

8. An Ag sputtering target according to claim 6, formed by Ag alloy containing rare-earth metal.

9. An Ag sputtering target according to claim 8, wherein a content of the rare-earth metal is not more than 5 atomic percent (not including 0 atomic percent).

* * * * *